(12) United States Patent
Kim et al.

(10) Patent No.: US 8,854,051 B2
(45) Date of Patent: Oct. 7, 2014

(54) INTEGRATED SYSTEM INCLUDING SIGNAL ANALYSIS CIRCUIT

(75) Inventors: Soo Yong Kim, Hwaseong-si (KR); Xuezhen Mao, Suwon-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 284 days.

(21) Appl. No.: 13/401,947

(22) Filed: Feb. 22, 2012

(65) Prior Publication Data

US 2012/0212237 A1 Aug. 23, 2012

(30) Foreign Application Priority Data

Feb. 22, 2011 (KR) ........................ 10-2011-0015683

(51) Int. Cl.
*G01R 27/28* (2006.01)
*G01R 31/28* (2006.01)

(52) U.S. Cl.
CPC .................................. *G01R 31/2837* (2013.01)
USPC ........................................................ 324/615

(58) Field of Classification Search
CPC ... G01R 23/16; G01R 19/0038; G01R 23/005
USPC .......................................................... 324/615
See application file for complete search history.

(56) References Cited

U.S. PATENT DOCUMENTS

| | | | | |
|---|---|---|---|---|
| 4,774,651 | A * | 9/1988 | El-Ibiary et al. ................. | 700/71 |
| 5,623,402 | A * | 4/1997 | Johnson ........................... | 700/42 |
| 5,796,922 | A * | 8/1998 | Smith .............................. | 706/23 |
| 6,643,807 | B1 | 11/2003 | Heaslip et al. | |
| 6,888,414 | B2 | 5/2005 | Albean | |
| 6,987,391 | B2 * | 1/2006 | Hagerling et al. ............. | 324/614 |
| 7,330,332 | B2 * | 2/2008 | Baek et al. .................. | 360/77.04 |
| 7,463,745 | B2 * | 12/2008 | Miller, III ..................... | 381/318 |
| 7,495,519 | B2 | 2/2009 | Kim et al. | |
| 7,675,445 | B2 * | 3/2010 | Robbe et al. .................. | 341/142 |
| 2006/0250194 | A1 | 11/2006 | Spahlinger | |

FOREIGN PATENT DOCUMENTS

KR    1020020011329    2/2002

\* cited by examiner

*Primary Examiner* — Arleen M Vazquez
*Assistant Examiner* — Feba Pothen
(74) *Attorney, Agent, or Firm* — F. Chau & Associates, LLC

(57) ABSTRACT

An integrated system is provided. The integrated system includes a control system and a signal analysis circuit configured to provide a test signal having a frequency to the control system, receive a feedback signal from the control system, and analyze the test signal and the feedback signal to generate a transfer function of the control system.

9 Claims, 9 Drawing Sheets

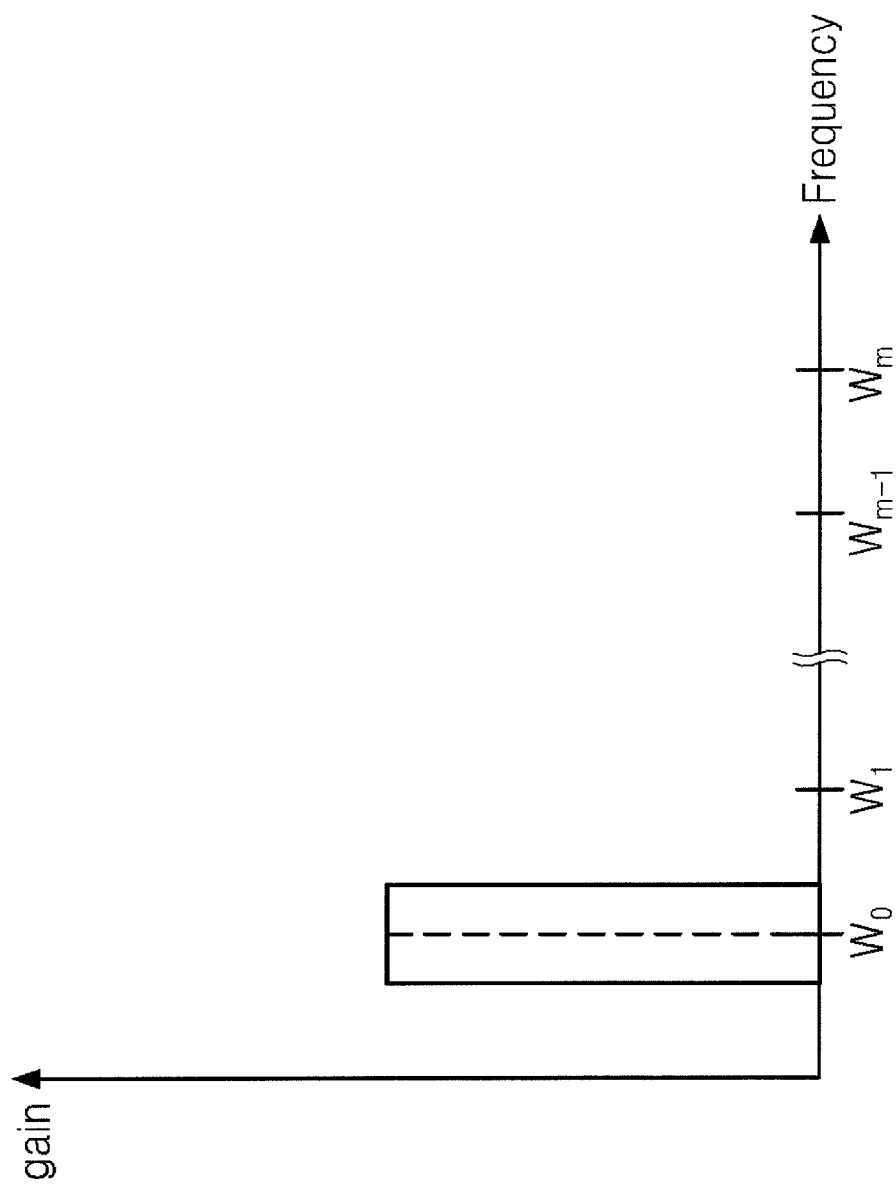

US 8,854,051 B2

INTEGRATED SYSTEM INCLUDING SIGNAL ANALYSIS CIRCUIT

CROSS-REFERENCE TO RELATED APPLICATIONS

This application claims priority under 35 U.S.C. §119(a) to Korean Patent Application No. 10-2011-0015683 filed on Feb. 22, 2011, the disclosure of which is incorporated by reference in its entirety herein.

BACKGROUND

1. Technical Field

Embodiments of the present inventive concept relate to an integrated system, and more particularly, to an integrated system including a signal analysis circuit, which generates or analyzes a transfer function of a control system.

2. Discussion of Related Art

The stability of a system can be improved using information about the dynamic characteristics of the system. A dynamic signal analyzer (DSA) is a device that measures the dynamic characteristics of the system. A frequency response characteristic of the system in a frequency domain is an example of one of the dynamic characteristics. However, it may be inefficient to measure the dynamic characteristics of every system using the DSA. Moreover, the DSA is expensive to manufacture and measuring methods using the DSA can be complex.

SUMMARY

According to an exemplary embodiment of the present inventive concept, an integrated system includes a control system and a signal analysis circuit configured to provide a test signal having a frequency to the control system, receive a feedback signal from the control system, and analyze the test signal and the feedback signal to generate a transfer function of the control system. The signal analysis circuit may also analyze the transfer function.

The signal analysis circuit may include a digital resonator configured to generate the test signal and provide the test signal to the control system and a signal analysis module configured to analyze the test signal and the feedback signal to generate the transfer function. The signal analysis module may analyze the generated transfer function.

The control system may include a pre-amplifier block configured to receive and amplify a feedback error signal output from a plant, a controller configured to generate a control signal in response to an output signal of the pre-amplifier block, an adder configured to add the control signal and the test signal, and a driver configured to output a driving signal for driving the plant in response to an output signal of the adder.

The transfer function, H(z), of the digital resonator may be defined by $$H(z) = G * \frac{1 - \cos(w0 * T)}{w0} \frac{z+1}{z^2 - 2\cos(w0 * T)z + 1}$$

where G is a gain of the test signal, "w0" is the frequency, T is a sampling interval at which the test signal is sampled, and z is an impedance of the digital resonator.

The signal analysis module may include a band pass filter configured to filter the feedback signal using a pass band including the frequency and a signal analyzer configured to sample the test signal and an output signal of the band pass filter, and analyze a sampling result to calculate the transfer function. The signal analyzer may output the calculated transfer function. The signal analyzer may calculate the transfer function of the control system using a discrete Fourier transform.

According to an exemplary embodiment of the present invention, an integrated system includes a control system and a signal analysis circuit configured to provide a test signal having a frequency to the control system, receive a feedback signal and an added signal obtained by adding the feedback signal and the test signal from the control system, and analyze the test signal and the added signal to generate a transfer function of the control system. The signal analysis circuit may be configured to analyze the transfer function.

The signal analysis circuit may include a digital resonator configured to generate the test signal and provide the test signal to the control system and a signal analysis module configured to analyze the test signal and the added signal to generate the transfer function. The signal analysis module may be configured to analyze the transfer function.

The control system may include a pre-amplifier block configured to receive and amplify a feedback error signal output from a plant, a controller configured to generate a control signal in response to an output signal of the pre-amplifier block, an adder configured to add the control signal and the test signal, and a driver configured to output a driving signal for driving the plant in response to an output signal of the adder.

The digital resonator may generate the test signal using a zero-order hold (ZOH) method.

The transfer function, H(z), of the digital resonator may be defined by $$H(z) = G * \frac{1 - \cos(w0 * T)}{w0} \frac{z+1}{z^2 - 2\cos(w0 * T)z + 1}$$

where G is a gain of the test signal, "w0" is the frequency, T is a sampling interval at which the test signal is sampled, and z is an impedance of the digital resonator.

The signal analysis module may include a first band pass filter configured to filter the feedback signal using a pass band including the frequency a second band pass filter configured to filter the added signal using the pass band and a signal analyzer configured to sample an output signal of the first band pass filter and an output signal of the second band pass filter, and analyze a sampling result to calculate the transfer function. The signal analyzer may output the calculated transfer function. The signal analyzer may calculate the transfer function of the control system using a discrete Fourier transform.

The control system maybe an open loop system and may be either an optical disk drive (ODD) or a hard disk drive (HDD).

According to an exemplary embodiment of the invention, an electronic system includes a digital resonator, a feedback loop circuit, and a signal analyzer. The digital resonator is configured to output a test signal of a pre-defined frequency. The feedback loop circuit receives the test signal as an input and provides a feedback signal as an output. The signal analyzer is configured to receive the feedback signal and the test signal, and calculate a transfer function of the feedback loop circuit from the received feedback signal and the test signal.

The feedback loop circuit may include a controller circuit that generates the feedback signal and an adder to perform an addition or a subtraction on the feedback signal and the test signal. A transfer function of the digital resonator may be based on a gain of the test signal, the pre-defined frequency, and a sampling interval at which the signal analyzer samples the test signal. The system may store a passband including the pre-defined frequency, and the system may further include a band pass filter that is configured to filter out frequencies of the feedback signal that are outside the passband. The system may be configured to periodically change the pre-defined frequency to another frequency that is within the passband.

BRIEF DESCRIPTION OF THE DRAWINGS

Embodiments of the present inventive concept will become more apparent by describing in detail exemplary embodiments thereof with reference to the attached drawings in which:

FIGS. 4A and 4B are graphs showing the frequency characteristics of a band pass filter illustrated in FIG. 3 according to an exemplary embodiment of the present inventive concept;

DETAILED DESCRIPTION

Figure 1:
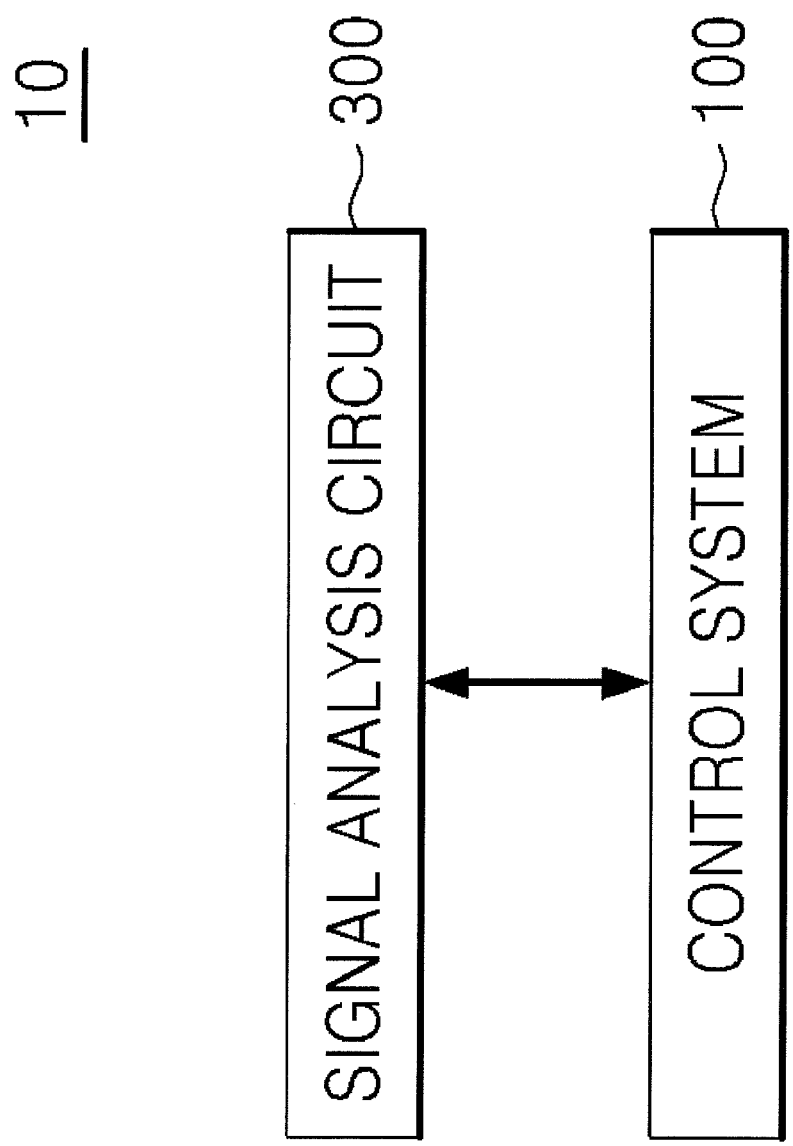
FIG. 1 is a schematic block diagram of an integrated system according to an exemplary embodiment of the present inventive concept.

Exemplary embodiments of the inventive concept will now be described more fully hereinafter with reference to the accompanying drawings. The exemplary embodiments may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present.

FIG. 1 is a schematic block diagram of an integrated system 10 according to an exemplary embodiment of the present inventive concept. Referring to FIG. 1, the integrated system 10 includes a control system 100 and a signal analysis circuit 300. The control system 100 may include a feedback loop circuit.

The control system 100 may be a normal control system including an optical disk drive (ODD) or a hard disk drive (HDD). An example of the ODD is a disk drive that uses laser light or electromagnetic waves near the light spectrum as part of the process of reading or writing data to or from optical discs. An example of the HDD is a non-volatile, random access digital magnetic data storage device. In an alternate embodiment, the control system 100 is a flash drive, which includes a flash memory.

The signal analysis circuit 300 may provide a test signal having a particular frequency to the control system 100. The control system 100 may output a feedback signal in response to receipt of the test signal. The signal analysis circuit 300 analyzes the test signal and the feedback signal to calculate a transfer function for the control system 100. The signal analysis circuit 300 may be integrated with at least one element of the control system 100 into a single chip.

Figure 2:
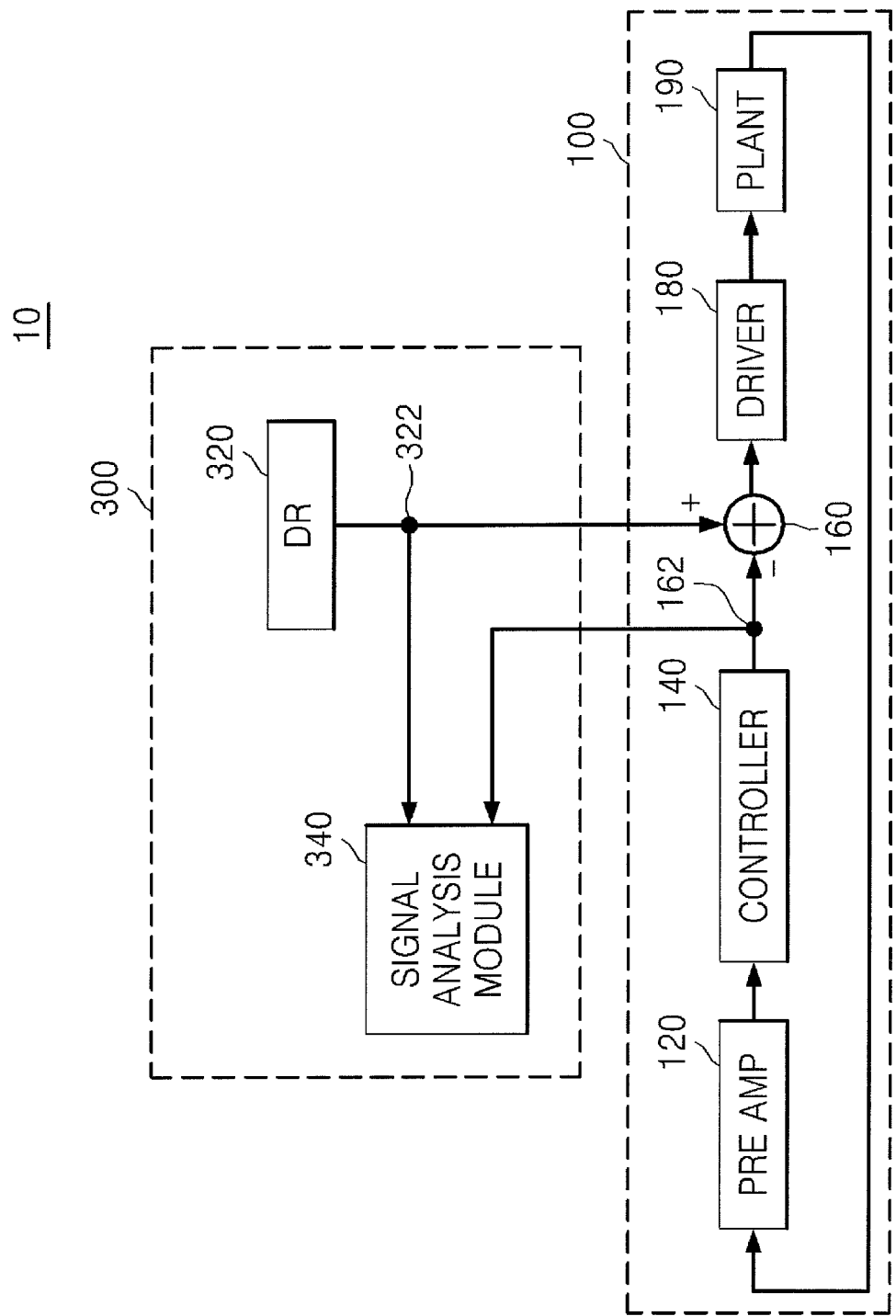
FIG. 2 is a detailed block diagram of the integrated system illustrated in FIG. 1 according to an exemplary embodiment of the present inventive concept.

FIG. 2 is a detailed block diagram of the integrated system 10 illustrated in FIG. 1. Referring to FIG. 2, the integrated system 10 includes a control system 100 and a signal analysis circuit 300.

The signal analysis circuit 300 provides a test signal having a particular frequency to the control system 100. The control system 100 may output a feedback signal to the signal analysis circuit 300 in response to receipt of the test signal. The signal analysis circuit 300 analyzes the test signal and the feedback signal to calculate a transfer function of the control system 100. The signal analysis circuit 300 may also analyze the calculated transfer function or some other transfer function of the control system 100. The signal analysis circuit 300 includes a digital resonator (DR) 320 and a signal analysis module 340.

The DR 320 generates the test signal and provides the test signal to the control system 100. The frequency of the test signal may be changed to a frequency in one or more predetermined frequency ranges. For example, the DR 320 may sweep the frequency of the test signal within a corresponding one of the predetermined frequency ranges. The system 10 may store these ranges.

The DR 320 may convert a continuous signal into a discrete signal using a zero-order hold (ZOH), a first-order hold (FOH), or a matched pole-zero method to generate the test signal. In other words, the test signal output from the DR 320 may be a discrete signal having a particular frequency.

When the DR 320 uses the ZOH, a transfer function H(z) of the DR 320 may be expressed by Equation 1:

$$H(z) = G * \frac{1 - \cos(w*T)}{w} \frac{z+1}{z^2 - 2\cos(w*T)z + 1} \quad (1)$$

where G is a gain of the test signal, "w" is the particular frequency of the test signal, T is a sampling interval at which the test signal is sampled, and z is the impedance of the DR 320.

The signal analysis module 340 analyzes the test signal and the feedback signal and calculates the transfer function of the control system 100.

The control system 100 may be a closed loop system. The control system 100 includes a pre-amplifier block 120, a controller 140, an adder 160, a driver 180, and a plant 190.

The pre-amplifier block 120 amplifies a feedback error signal output from the plant 190. The pre-amplifier block 120 may include a band pass filter having a predetermined gain. When the control system 100 is implemented by an ODD, the pre-amplifier block 120 may amplify a tracking error signal or a focus error signal output from the plant 190.

The controller 140 generates a control signal (e.g., a feedback signal) in response to an output signal of the pre-amplifier block 120. The controller 140 may compare the amplified feedback error signal with a reference signal and generate a control signal for controlling the driving of the plant 190. When the control system 100 is implemented by an ODD, the controller 140 may be a focus equalizer or a tracking equalizer.

The adder 160 receives the control signal and the test signal, performs addition (or subtraction) on the control signal and the test signal, and outputs an added (or a subtracted) signal. The adder 160 is connected between an output terminal 162 of the controller 140 and an input terminal of the driver 180 as illustrated in FIG. 2, but embodiments of the present inventive concept are not limited thereto. Indeed, the position of the adder 160 may be changed in alternate embodiments. For instance, the adder 160 may be positioned between the pre-amplifier block 120 and the controller 140, between the driver 180 and the plant 190, or between the plant 190 and the pre-amplifier block 120. For example, when the adder 160 is located between the pre-amplifier block 120 and the controller 140, the adder 160 performs an addition or a subtraction on the output of the pre-amplifier block 120 and the test signal. Further, the output of the pre-amplifier block 120 may be output as the feedback signal to the signal analysis module 340 when the adder 160 is located between driver 180 and the plant 190. For example, when the adder 160 is located between the driver 180 and the plant 190, the adder 160 performs an addition or a subtraction on the output of the driver 180 and the test signal. Further, the output of the driver 180 may be output as the feedback signal to the signal analysis module 340 when the adder 160 is located between the pre-amplifier 120 and the controller 140.

The driver 180 outputs a driving signal for driving the plant 190 in response to an output signal of the adder 160. For instance, the driver 180 may output a current (or a voltage) corresponding to the output signal of the adder 160. The current (or voltage) provides driving power for the plant 190.

The plant 190 is a target to be controlled by the control system 100 and performs an operation corresponding to the driving signal output from the driver 180. The plant 190 also outputs an error signal according to the performed operation (e.g., the feedback error signal). To output the feedback error signal, the plant 190 may include a detector (not shown) which detects an error.

When the control system 100 is implemented by an ODD, the plant 190 may be an optical head of the ODD. The plant 190 may perform an operation corresponding to the driving signal output from the driver 180 and output an error according to the performed operation (e.g., a tracking error signal or a focus error signal).

Figure 3:
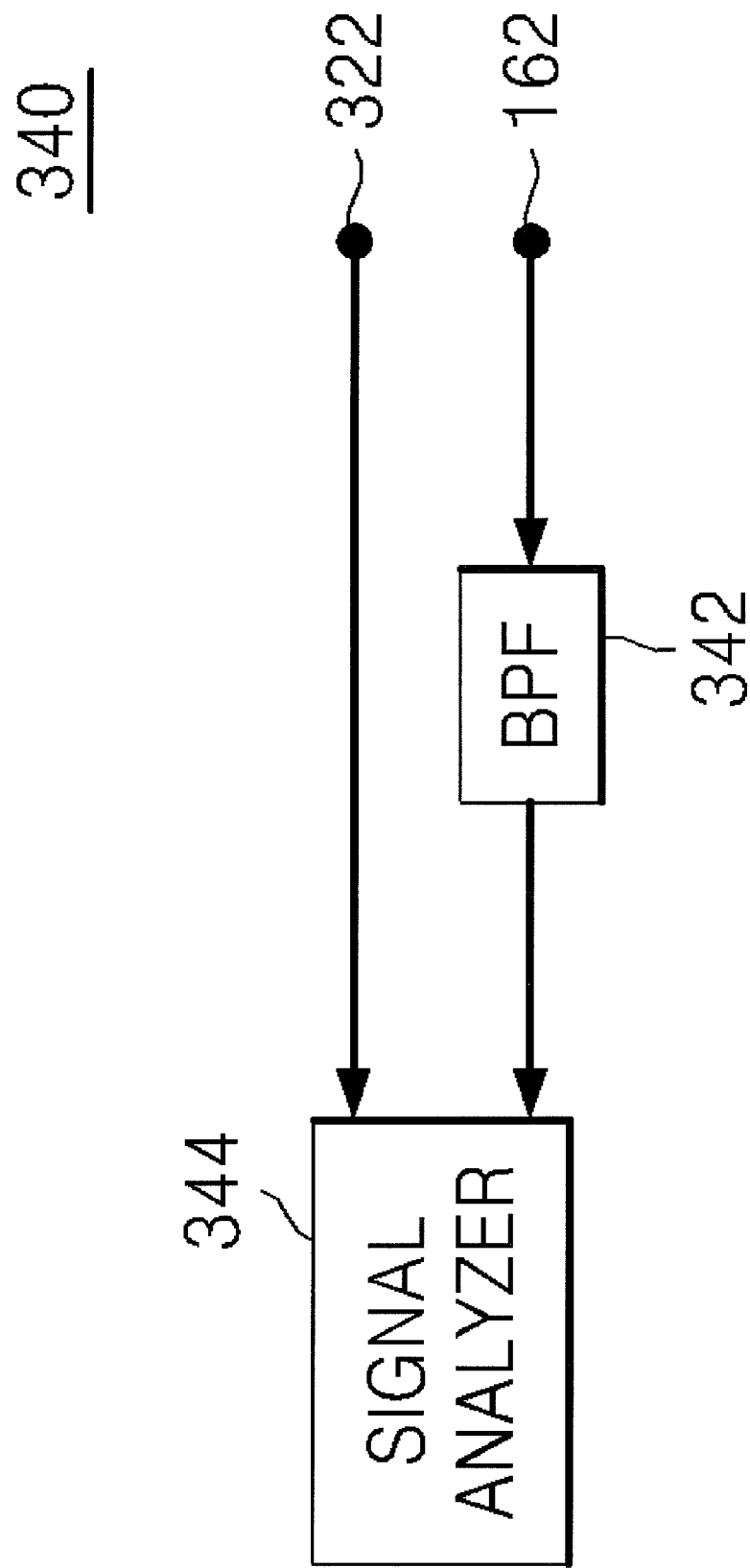
FIG. 3 is a block diagram of a signal analysis module illustrated in FIG. 2 according to an exemplary embodiment of the present inventive concept.

FIG. 3 is a block diagram of the signal analysis module 340 illustrated in FIG. 2. Referring to FIG. 3, the signal analysis module 340 may be implemented as a circuit or logic and includes a band pass filter (BPF) 342 and a signal analyzer 344.

The BPF 342 receives the output signal of the control system 100 (e.g., the feedback signal) and filters the feedback signal based on a pass band including the particular frequency of the test signal. For example, the BPF 342 passes frequencies within the pass band and rejects (attenuates) frequencies outside the pass band. The signal analyzer 344 receives an output signal of the BPF 342 and the output signal of the DR 320. In other words, the signal analyzer 344 receives the test signal and a signal filtered by the BPF 342.

The signal analyzer 344 may sample the test signal and the filtered signal and calculate the transfer function of the control system 100 using a sampling result. The signal analyzer 344 may perform this sampling periodically. In at least one embodiment of the invention, the signal analyzer 344 calculates the transfer function using a discrete Fourier transform.

Figure 4B:
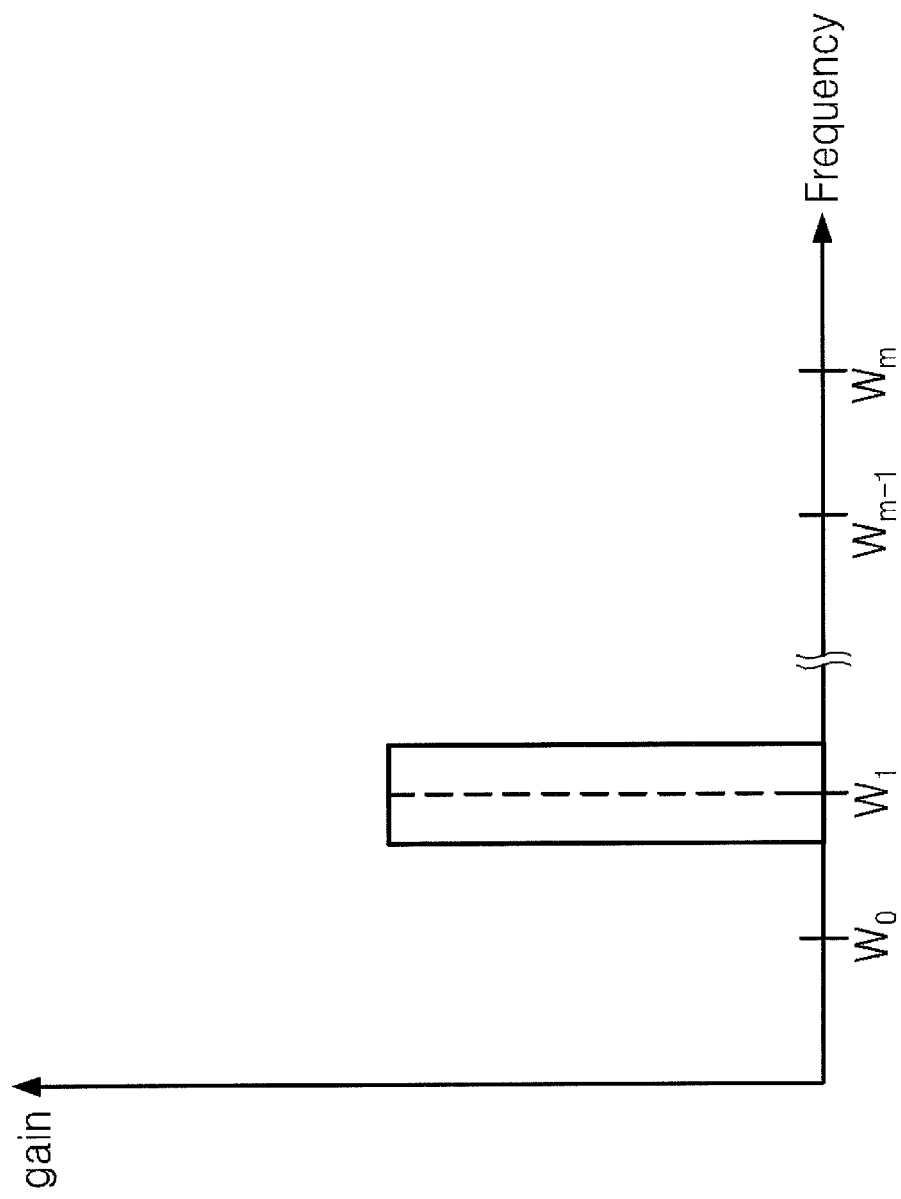

FIGS. 4A and 4B are exemplary graphs showing the frequency characteristics of the BPF 342 illustrated in FIG. 3. Referring to FIG. 4A, the pass band of the BPF 342 includes a frequency of w0. In this example, the frequency of the test signal output from the DR 320 is w0. The bandwidth of the pass band may vary with embodiments of the invention.

Referring to FIG. 4B, the pass band of the BPF 342 includes a frequency of w1. In this example, the frequency of the test signal output from the DR 320 is w1.

As described above, the pass band of the BPF 342 varies with the frequency of the test signal. Accordingly, when the DR 320 outputs the test signal having the particular frequency in a frequency range from w0 to wm, the BPF 342 may filter the feedback signal using a pass band including the particular frequency.

An exemplary operation of the integrated system 10 will be described in detail below. Referring to FIGS. 1 through 4B, the DR 320 generates a test signal having the frequency of w0 and provides the test signal to the control system 100. For example, the test signal is provided to the control system 100 through the adder 160. The test signal is also provided to the signal analyzer 344.

The control system 100 receives the test signal and outputs a feedback signal corresponding to the test signal. The feedback signal is the output signal of the controller 140. The BPF 342 receives the feedback signal and filters the feedback signal using a pass band including the frequency w0 of the test signal.

The signal analyzer 344 samples the test signal and may calculate the amplitude and the phase of the test signal using a sampling result. When the test signal is sampled N times (where N is a natural number) during a single period, a result of sampling the test signal may be expressed by $y_1(k*T)$ ($k=0, 1, 2, \ldots, N-1$) where T is a sampling interval.

The test signal includes a sine component $B_{1s}$ and a cosine component $B_{1c}$. The signal analyzer 344 may calculate the sine component $B_{1s}$ and the cosine component $B_{1c}$ using Equations 2:

$$B_{1c} = \frac{2}{N} * \sum_{k=0}^{N-1} y_1(k*T) * \cos(w0*k*T) \qquad (2)$$

$$B_{1s} = \frac{2}{N} * \sum_{k=0}^{N-1} y_1(k*T) * \sin(w0*k*T).$$

The signal analyzer 344 may obtain the amplitude $|B_1|$ and the phase $\Phi_1$ of the test signal using $B_{1s}$ and $B_{1c}$. The amplitude $|B_1|$ and the phase $\Phi_1$ may be obtained using Equations 3:

$$|B_1| = \sqrt[2]{B_{1c}^2 + B_{1s}^2} \qquad (3)$$

$$\Phi_1 = \tan^{-1}\frac{B_{1c}}{B_{1s}}.$$

The signal analyzer 344 may sample an output signal of the BPF 342 and calculate the amplitude and the phase of the output signal of the BPF 342 using a sampling result.

When sampling is performed N times during a single period of the output signal of the BPF 342, the sampling result may be expressed by $y_2(k*T)$ ($k=0, 1, 2, \ldots, N-1$) where T is a sampling interval. The output signal of the BPF 342 includes a sine component $B_{2s}$ and a cosine component $B_{2c}$. The signal analyzer 344 may calculate the sine component $B_{2s}$ and the cosine component $B_{2c}$ using Equations 4:

$$B_{2c} = \frac{2}{N} * \sum_{k=0}^{N-1} y_2(k*T) * \cos(w0*k*T) \quad (4)$$

$$B_{2s} = \frac{2}{N} * \sum_{k=0}^{N-1} y_2(k*T) * \sin(w0*k*T).$$

The signal analyzer 344 may obtain the amplitude $|B_2|$ and the phase $\Phi_2$ of the output of the BPF 342 using $B_{2s}$ and $B_{2c}$. For example, the amplitude $|B_2|$ and the phase $\Phi_2$ may be obtained using Equations 5:

$$|B_2| = \sqrt[2]{B_{2c}^2 + B_{2s}^2} \quad (5)$$

$$\Phi_2 = \tan^{-1}\frac{B_{2c}}{B_{2s}}.$$

The signal analyzer 344 may obtain a transfer function G(s) of the control system 100. For example, the signal analyzer 344 may calculate an amplitude $|G(j*w0)|$ and a phase $\angle G(j*w0)$ of the transfer function G(s). The amplitude $|G(j*w0)|$ and the phase $\angle G(j*w0)$ may be calculated using Equations 6:

$$|G(j*w0)| = \frac{|B_2|}{|B_1|} \quad (6)$$

$$\angle G(j*w0) = \Phi_2 - \Phi_1.$$

After calculating the amplitude $|G(j*w0)|$ and the phase $\phi G(j*w0)$, the signal analyzer 344 may output a calculation result.

In the same manner, the signal analysis circuit 300 may provide a test signal having the frequency of w1 to the control system 100, then receive a feedback signal, and then calculate the frequency response characteristics of the control system 100.

Consequently, the signal analysis circuit 300 may provide a test signal having a frequency changing within a predetermined frequency range to the control system 100 and calculate the frequency response characteristics (e.g., the transfer function of the control system 100) within the predetermined frequency range. When the transfer function is used, the control system 100 can be accurately controlled.

Figure 5:
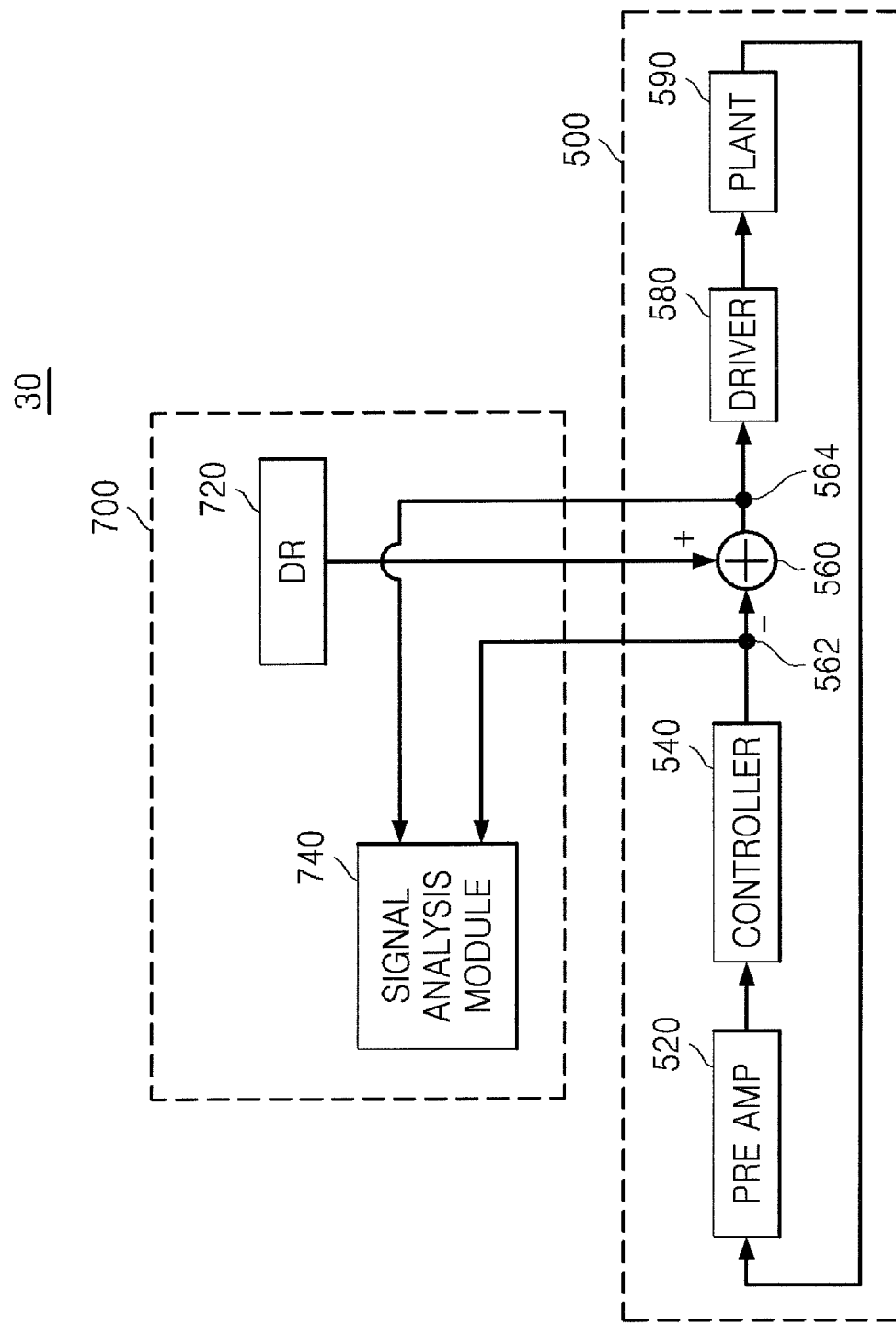
FIG. 5 is a detailed block diagram of the integrated system illustrated in FIG. 1 according to an exemplary embodiment of the present inventive concept.

FIG. 5 is a detailed block diagram of an integrated system 30 illustrated FIG. 1 according to an exemplary embodiment of the present inventive concept. Since the integrated system 30 has a similar structure to the integrated system 10 illustrated in FIG. 2, redundant descriptions will be omitted.

Referring to FIG. 5, the integrated system 30 includes a control system 500 and a signal analysis circuit 700. The integrated system 30 may be an open loop system. The control system 500 may include a feedback loop circuit.

The signal analysis circuit 700 provides a test signal having a particular frequency to the control system 500. The signal analysis circuit 700 may receive a feedback signal and an added (or subtracted) signal obtained by performing addition (or subtraction) on the test signal and the feedback signal from the control system 500 and analyze the test signal and the added (or subtracted) signal to calculate a transfer function of the control system 500. The signal analysis circuit 700 may also analyze the calculated transfer function.

The signal analysis circuit 700 includes a DR 720 and a signal analysis module 740. The DR 720 generates the test signal and provides the test signal to the control system 500. The frequency of the test signal may be changed to a predetermined frequency range. In other words, the DR 720 may sweep the frequency of the test signal within the predetermined frequency range. The signal analysis module 740 analyzes the test signal and the added signal to calculate the transfer function of the control system 500.

The control system 500 may be an open loop system. The control system 500 includes a pre-amplifier block 520, a controller 540, an adder 560, a driver 580, and a plant 590.

The pre-amplifier block 520 receives and amplifies a feedback error signal output from the plant 590. The pre-amplifier block 520 may include a band pass filter having a predetermined gain.

The controller 540 generates a control signal in response to an output signal of the pre-amplifier block 520. The adder 560 receives the control signal and the test signal, performs addition (or subtraction) on the control signal and the test signal, and outputs an added (or a subtracted) signal. The adder 560 is connected between an output terminal 562 of the controller 540 and an input terminal 564 of the driver 580 as illustrated in FIG. 5, but embodiments of the present inventive concept are not restricted thereto. As discussed above with respect to the adder 160 of FIG. 2, the position of the adder 560 may be changed in alternate embodiments.

The driver 580 outputs a driving signal for driving the plant 590 in response to an output signal of the adder 560. For instance, the driver 580 may output a current (or a voltage) corresponding to the output signal of the adder 560. The current (or voltage) provides driving power for the plant 590.

The plant 590 is a target to be controlled by the control system 500 and performs an operation corresponding to the driving signal output from the driver 580. The plant 590 also outputs an error according to the performed operation (e.g., the feedback error signal). To output the feedback error signal, the plant 590 may include a detector (not shown) which detects an error.

Figure 6:
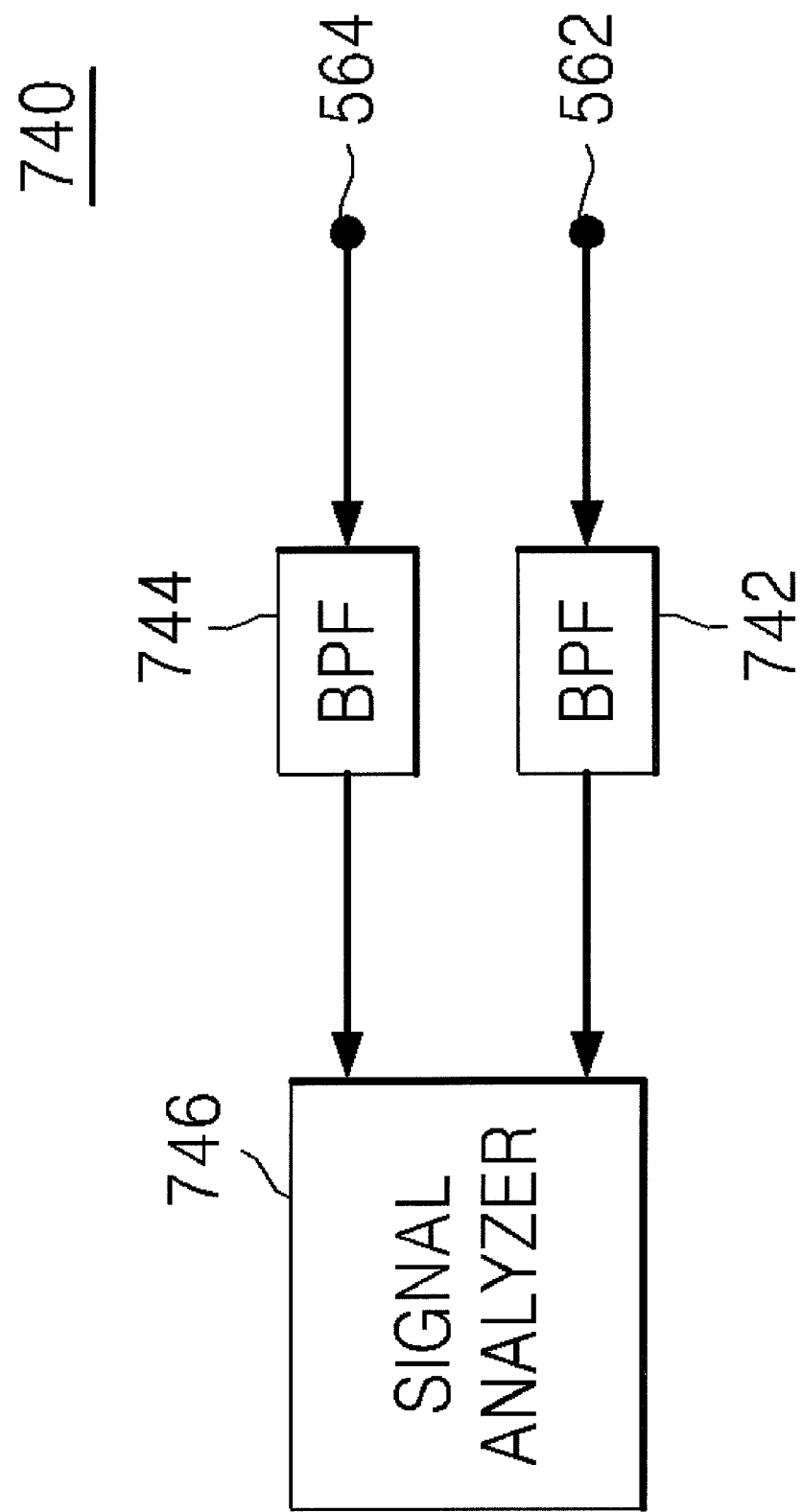
FIG. 6 is a block diagram of a signal analysis module illustrated in FIG. 5 according to an exemplary embodiment of the present inventive concept.

FIG. 6 is a block diagram of the signal analysis module 740 illustrated in FIG. 5 according to an exemplary embodiment of the present inventive concept. Referring to FIG. 6, the signal analysis module 740 includes a first BPF 742, a second BPF 744, and a signal analyzer 746.

The first BPF 742 receives the feedback signal and filters the feedback signal based on a pass band including the particular frequency. The second BPF 744 receives the added signal and filters the added signal based on the pass band.

The signal analyzer 746 receives an output signal of the first BPF 742 and the output signal of the second BPF 744. In other words, the signal analyzer 746 receives a signal filtered by the first BPF 742 and a signal filtered by the second BPF 744. The signal analyzer 746 may sample an output signal of the first BPF 742 and an output signal of the second BPF 744 and calculate the transfer function of the control system 500 using a sampling result.

Figure 7:
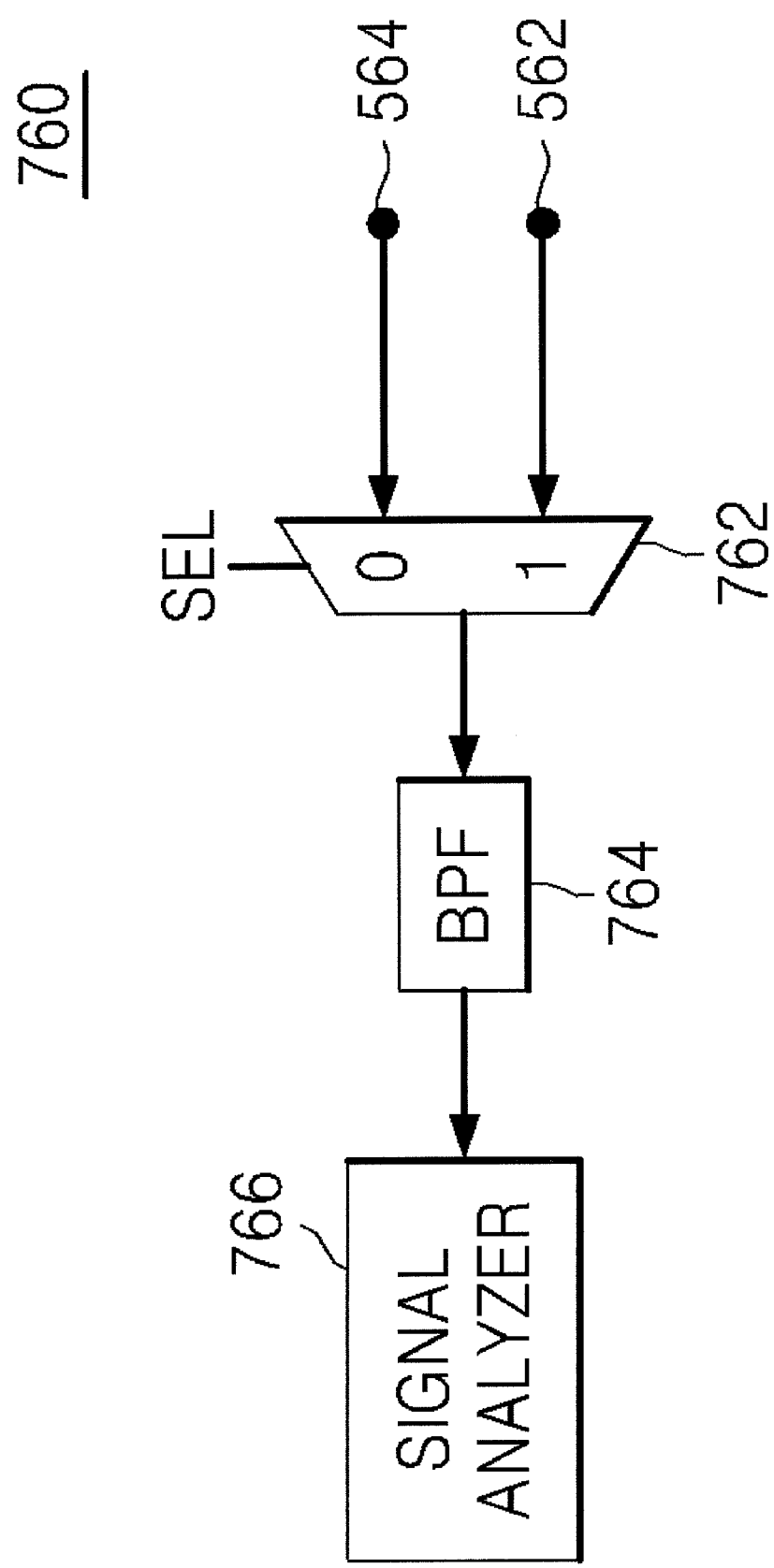
FIG. 7 is a block diagram of the signal analysis module illustrated in FIG. 5 according to an exemplary embodiment of the present inventive concept.

FIG. 7 is a block diagram of the signal analysis module 740 illustrated in FIG. 5 according to an exemplary embodiment of the present inventive concept. Referring to FIG. 7, the signal analysis module 760 includes a selector 762 (e.g., a multiplexer), a BPF 764, and a signal analyzer 766.

The selector 762 outputs either the feedback signal or the added signal in response to a selection signal SEL. The selection signal SEL may be output by the signal analyzer 766. The BPF 764 receives an output signal of the selector 762 and filters the output signal using a pass band including the particular frequency.

The signal analyzer 766 receives an output signal of the BPF 764. The signal analyzer 766 may sample the output signal of the BPF 764 and calculate the transfer function of the control system 500 using a sampling result.

Figure 8:
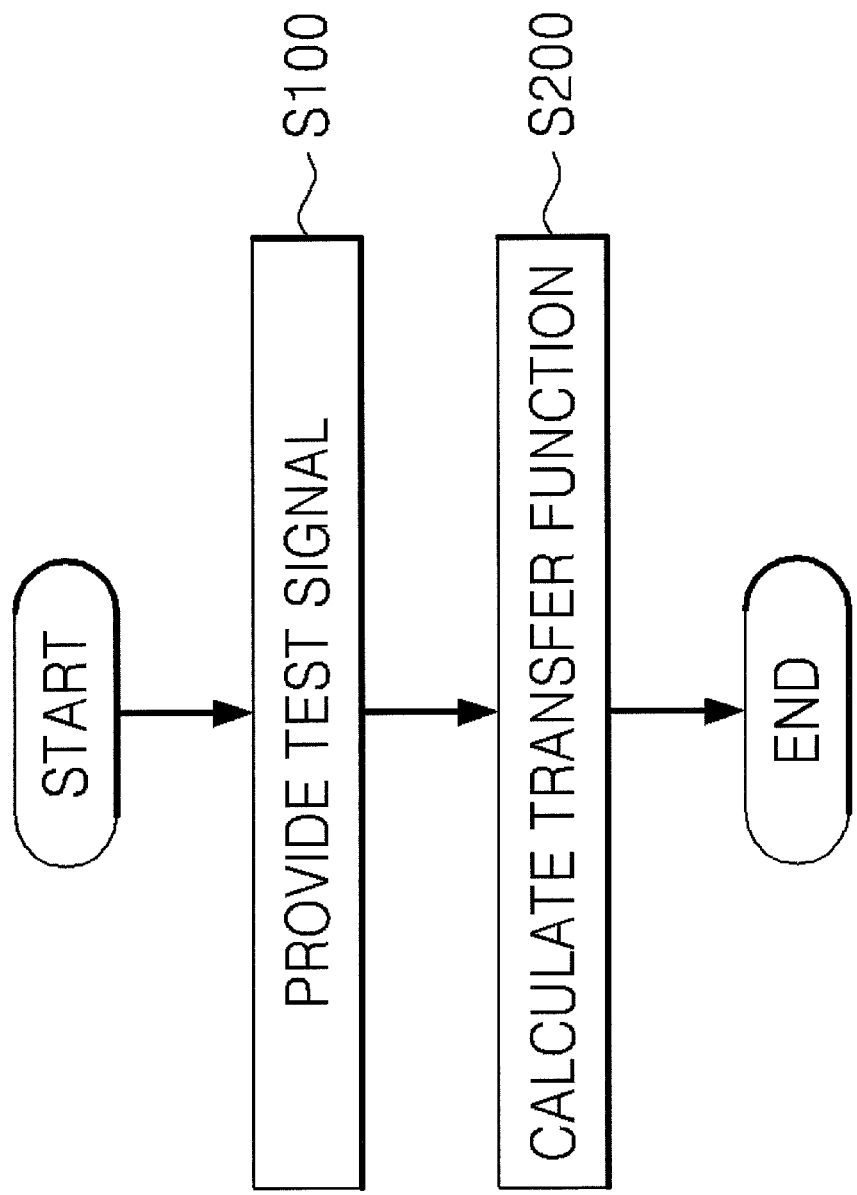
FIG. 8 is a flowchart of a method of calculating a transfer function of a control system according to an exemplary embodiment of the present inventive concept.

An operation of the integrated system 30 illustrated in FIG. 5 is similar to that of the integration system 10 illustrated in FIG. 2. FIG. 8 is a flowchart of a method of calculating a transfer function of a control system 100 according to an exemplary embodiment of the present inventive concept.

Referring to FIG. 8, the method includes providing a test signal having a particular frequency to the control system 100 using the DR 320 in operation S100 and analyzing a feedback signal from the control system 100 and the test signal to calculate a transfer function in operation S200. As an example, the test signal may be a discrete signal generated using the ZOH method.

Operation S200 may include filtering the feedback signal based on a pass band including the particular frequency using a BPF and sampling the test signal and an output signal of the BPF. The transfer function may be calculated using a discrete Fourier transform. Consequently, the transfer function may be calculated by repeating the method with the particular frequency changed to another frequency within a predetermined frequency range.

The above-described method may be performed to calculate the transfer function using the integrated system 10 illustrated in FIG. 2 or the integrated system 30 illustrated in FIG. 5.

As described above, according to at least one embodiment of the present inventive concept, an integrated system calculates a transfer function of a control system, which may be used to improve the stability of the control system. For example, the integrated system may perform an analysis of the transfer function and use the analysis result to improve the stability of the control system.

While the present inventive concept has been particularly shown and described with reference to exemplary embodiments thereof, it will be understood by those of ordinary skill in the art that various changes in forms and details may be made therein without departing from the spirit and scope of the present disclosure.

What is claimed is:

1. An integrated system comprising:
a control system configured to provide a feedback signal based on a previous driving of a target device and an added signal for a current driving of the target device; and
a signal analysis circuit configured to provide a test signal having a frequency to the control system, receive the feedback signal and the added signal obtained by adding the feedback signal and the test signal from the control system, and analyze the feedback signal and the added signal to generate a transfer function of the control system,
wherein the signal analysis circuit comprises a digital resonator configured to convert a continuous signal into a discrete signal to generate the test signal and provide the test signal to the control system.

2. The integrated system of claim 1, wherein the signal analysis circuit comprises:
a signal analysis module configured to analyze the feedback signal and the added signal to generate the transfer function.

3. The integrated system of claim 1, wherein the control system comprises:
a pre-amplifier block configured to receive and amplify a feedback error signal output from a plant;
a controller configured to generate a control signal in response to an output signal of the pre-amplifier block;
an adder configured to add the control signal and the test signal; and
a driver configured to output a driving signal for driving the plant in response to an output signal of the adder.

4. The integrated system of claim 2, wherein the digital resonator generates the test signal using a zero-order hold (ZOH) method.

5. The integrated system of claim 2, wherein a transfer function, H(z), of the digital resonator is defined by $$H(z) = G * \frac{1 - \cos(w*T)}{w} \cdot \frac{z+1}{z^2 - 2\cos(w*T)z + 1}$$

where G is a gain of the test signal, "w" is the frequency, T is a sampling interval at which the test signal is sampled, and z is an impedance of the digital resonator.

6. The integrated system of claim 2, wherein the signal analysis module comprises:
a first band pass filter configured to filter the feedback signal using a pass band including the frequency;
a second band pass filter configured to filter the added signal using the pass band; and
a signal analyzer configured to sample an output signal of the first band pass filter and an output signal of the second band pass filter and analyze a sampling result to calculate the transfer function.

7. The integrated system of claim 6, wherein the signal analyzer calculates the transfer function of the control system using a discrete Fourier transform.

8. The integrated system of claim 7, wherein the control system is an open loop system.

9. The integrated system of claim 7, wherein the control system is an optical disk drive (ODD) or a hard disk drive (HDD).

* * * * *